United States Patent
Miyazawa et al.

(10) Patent No.: US 8,217,885 B2
(45) Date of Patent: Jul. 10, 2012

(54) ENHANCING TIME-WISE LIKELIHOOD FOR A LEAK CURRENT FROM A FLOATING MEMORY NODE IN A DISPLAY DEVICE HAVING A SHIFT REGISTER CIRCUIT

(75) Inventors: Toshio Miyazawa, Chiba (JP); Masahiro Maki, Mobara (JP); Hideo Sato, Hitachi (JP); Takumi Shigaki, Mobara (JP)

(73) Assignees: Hitachi I Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 650 days.

(21) Appl. No.: 12/379,521

(22) Filed: Feb. 24, 2009

(65) Prior Publication Data
US 2009/0225019 A1  Sep. 10, 2009

(30) Foreign Application Priority Data
Mar. 4, 2008 (JP) ................................. 2008-053314

(51) Int. Cl.
*G09G 3/36* (2006.01)
*G11C 19/00* (2006.01)
(52) U.S. Cl. .......................... 345/100; 377/64
(58) Field of Classification Search .............. 345/60–72, 345/76–83, 87–104, 204–215, 690–699; 377/64–81
See application file for complete search history.

(56) References Cited

U.S. PATENT DOCUMENTS

| | | | |
|---|---|---|---|
| 6,801,194 B2 | 10/2004 | Miyazawa et al. | |
| 7,477,221 B2 | 1/2009 | Miyazawa et al. | |
| 7,733,320 B2 | 6/2010 | Yamaguchi et al. | |
| 2002/0047836 A1* | 4/2002 | Miyazawa et al. | 345/204 |
| 2005/0285113 A1* | 12/2005 | Miyazawa et al. | 257/72 |
| 2006/0210012 A1* | 9/2006 | Yamaguchi et al. | 377/64 |
| 2007/0115245 A1* | 5/2007 | Nakao et al. | 345/100 |
| 2007/0194973 A1* | 8/2007 | Nakao et al. | 341/155 |

FOREIGN PATENT DOCUMENTS

| | | |
|---|---|---|
| CN | 1367476 A | 9/2002 |
| CN | 1713266 A | 12/2005 |
| CN | 1835063 A | 9/2006 |
| JP | 2006010784 A * | 1/2006 |

* cited by examiner

*Primary Examiner* — Alexander Eisen
*Assistant Examiner* — Patrick F Marinelli
(74) *Attorney, Agent, or Firm* — Stites & Harbison, PLLC; Juan Carlos A. Marquez, Esq

(57) ABSTRACT

In a display device which includes a driver circuit having a shift register circuit, the shift register circuit is constituted of basic circuits in plural stages. Each basic circuit is constituted of a circuit A, a circuit B and a circuit C. The circuit A fetches a first drive clock (or a second drive clock) inputted from the outside when transfer data is inputted to the circuit A from a circuit of preceding stage, outputs the transfer data as a shift output of own stage, and transfers the transfer data to the circuit B. The circuit B transfers the transfer data to the circuit A of the basic circuit of the succeeding stage, and resets the circuit C. The circuit C resets the circuit A and the circuit B in synchronism with the first drive clock (or the second drive clock) generated at next timing or succeeding timing of the first drive clock.

11 Claims, 9 Drawing Sheets

ENHANCING TIME-WISE LIKELIHOOD FOR A LEAK CURRENT FROM A FLOATING MEMORY NODE IN A DISPLAY DEVICE HAVING A SHIFT REGISTER CIRCUIT

The present application claims priority from Japanese applications JP2008-053314 filed on Mar. 4, 2008, the content of which is hereby incorporated by reference into this application.

BACKGROUND OF THE INVENTION

1. Field of the Invention

The present invention relates to a display device, and more particularly to a technique which is effectively applicable to a display device having a shift register circuit.

2. Description of the Related Art

For example, in an active-matrix-type liquid crystal display device which uses thin film transistors (TFT) as active elements, on a liquid-crystal-side surface of one substrate out of substrates which are arranged to face each other in an opposed manner with liquid crystal sandwiched therebetween, pixel regions are formed. Each pixel region is surrounded by two scanning lines which extend in the x direction and are arranged parallel to each other in the y direction and two video lines which extend in the y direction and are arranged parallel to each other in the x direction. The pixel region includes the thin film transistor (TFT) which is operated in response to the supply of a scanning signal from the scanning line.

The liquid crystal display device includes a scanning line driver circuit which supplies a scanning signal to the respective scanning lines, and a video line driver circuit which supplies a video signal to the respective video lines, and these driver circuits respectively include a shift register circuit.

On the other hand, there has been also known a polysilicon-type liquid crystal display device in which a semiconductor layer of a thin film transistor which constitutes the above-mentioned active element is made of polycrystalline silicon (polysilicon). In such a polysilicon-type liquid crystal display device, the thin film transistor (for example, MIS transistor) which constitutes the scanning line driver circuit and the video line driver circuit is also formed on the above-mentioned surface of one substrate in the same step as the thin film transistor which constitutes the active element.

A liquid crystal display device which includes a single-channel (n-MOS) shift register circuit as the scanning line driver circuit is disclosed in JP-A-2002-215118 (patent document 1) and JP-A-2006-10784 (patent document 2), for example.

FIG. 9 is a circuit diagram showing the circuit constitution of the single-channel (n-MOS) shift register circuit disclosed in the above-mentioned patent document 1.

The manner of operation of the shift register circuit shown in FIG. 9 is explained hereinafter.

(1) When a start pulse ((ΦDIN) is at a High level (hereinafter, referred to as H level), a transistor (NMT3) is turned on, and a reference voltage (VSS) is inputted to a gate of a transistor (NMT2) and hence, the transistor (NMT2) is turned off. Accordingly, a node (N1) assumes an H level (in a strict sense, VH−Vth) via a transistor (NMT1) in diode connection. Here, symbol VH indicates an H level voltage of a first drive clock (Φ1) and a second drive clock (Φ2), and symbol Vth indicates a threshold voltage of the transistor (NMT*). Further, when the node (N1) assumes the H level, a transistor (NMT7) is turned on, and the reference voltage (VSS) is inputted to a gate of a transistor (NMT6) and hence, the transistor (NMT6) is turned off. Thereafter, the start pulse ((ΦIN) assumes a Low level (hereinafter, referred to as L level).

(2) Next, when the second drive clock ((Φ2) assumes an H level, a node (N2) assumes an H level via a transistor (NMT4). Accordingly, a voltage of the node (N1) is further increased due to a bootstrap effect generated by a capacitive element (CB1). Then, the second drive clock having no voltage drop is outputted to the node (N2), and this second drive clock becomes a shift output (OUT1). Here, the transistor (NMT7) maintains an ON state, and the transistor (NMT6) maintains an OFF state.

Further, when the node (N2) assumes an H level, a transistor (NMT5) is turned on and hence, a node (N3) also assumes an H level (in a strict sense, VH−Vth). Then, when the node (N3) assumes an H level, a transistor (NMT11) is turned on, and the reference voltage (VSS) is inputted to a gate of a transistor (NMT15) and hence, the transistor (NMT15) is turned off.

(3) Next, when the first drive clock (Φ1) assumes an H level, a node (N4) assumes an H level via a transistor (NMT8). Accordingly, a voltage of the node (N3) is further increased due to a bootstrap effect generated by a capacitive element (CB2). Then, the first drive clock having no voltage drop is outputted to the node (N4), and this first drive clock becomes a shift output (OUT2). Here, the transistor (NMT11) maintains an ON state, and the transistor (NMT15) maintains an OFF state.

Further, when the node (N4) assumes an H level, a transistor (NMT9) is turned on and hence, a node (N6) also assumes an H level (in a strict sense, VH−Vth). Then, when the node (N6) assumes an H level, a transistor (NMT16) is turned on, and the reference voltage (VSS) is inputted to a gate of a transistor (NMT20) and hence, the transistor (NMT20) is turned off.

Further, when the node (N4) assumes the H level, a transistor (NMT10) is also turned on and hence, the node (N5) also assumes an H level (in a strict sense, VH−Vth). Then, when the node (N5) assumes the H level, the transistor (NMT2) is turned on, and the node (N1) assumes the reference voltage (VSS).

Operations similar to the above-mentioned operations are repeatedly performed thereafter.

SUMMARY OF THE INVENTION

In the single-channel shift register circuit disclosed in the above-mentioned patent document 1, to maintain a stable operation, gates of transistors (NMT2, NMT6, NMT15, . . . in FIG. 9) which connect floating nodes of non-selected stages (N1, N3, N6, . . . in FIG. 9) to a bias power source (Vss) constitute floating memory nodes.

Writing of voltages in the floating memory nodes reflects scanning states of the respective stages, and writing (refreshing) is performed one time in one scanning. Accordingly, leak currents from the floating memory nodes influence the operational stability. Particularly, when the threshold voltages Vth of the reset transistors (NMT3, NMT7, NMT11, . . . in FIG. 9) for the floating memory nodes are low, the leak currents from the reset transistors (NMT3, NMT7, NMT11, . . . in FIG. 9) are increased and hence, a stable operation is deteriorated resulting in a possibility of lowering of likelihood of the threshold values.

The present invention has been made to overcome the above-mentioned drawbacks of the related art, and it is an object of the present invention to provide, in a display device having a single-channel shift register circuit, a technique which can enhance time-wise likelihood for a leak current from a floating memory node by increasing the number of times of writing of a voltage in the floating memory node.

To briefly explain the summary of typical inventions among the inventions disclosed in this specification, they are as follows.

(1) According to one aspect of the present invention, there is provided a display device which includes: a display panel having a plurality of pixels; and a driver circuit which drives the respective pixels, the driver circuit having a shift register circuit, wherein each shift register circuit is constituted of basic circuits in plural stages, the basic circuit is constituted of a circuit A, a circuit B and a circuit C, in the odd-numbered basic circuit, the circuit A fetches a first drive clock inputted from the outside at the time of inputting of transfer data from the basic circuit of preceding stage, outputs the first drive clock as a shift output of the basic circuit of own stage, and transfers transfer data to the circuit B, the circuit B transfers the transfer data to the circuit A of the basic circuit of succeeding stage and resets the circuit C, the circuit C resets the circuit A and the circuit B in synchronism with a first drive clock generated at next timing or at timing which comes after the next timing of the first drive clock, and in the even-numbered basic circuit, the circuit A fetches a second drive clock which is inputted from the outside and has a phase different from a phase of the first drive clock at the time of inputting of transfer data from the basic circuit of preceding stage, outputs the second drive clock as a shift output of the basic circuit of own stage, and transfers transfer data to the circuit B, the circuit B transfers the transfer data to the circuit A of the basic circuit of succeeding stage and resets the circuit C, and the circuit C resets the circuit A and the circuit B in synchronism with a second drive clock generated at next timing or timing which comes after the next timing of the second drive clock.

(2) In the display device having the above-mentioned constitution (1), the circuit A of each basic circuit includes: a first transistor which outputs the shift output from a second electrode; a first capacitive element which is connected between a control electrode of the first transistor and the second electrode; and a first reset transistor which is connected between the second electrode of the first transistor and a reference voltage and has an ON/OFF operation thereof controlled by the circuit C of the basic circuit of own stage, a first drive clock is inputted to a first electrode of the first transistor of the circuit A of each odd-numbered basic circuit, a second drive clock is inputted to the first electrode of the first transistor of the circuit A of each even-numbered basic circuit, and the circuit B of each basic circuit includes a second transistor in diode connection which is connected between a second electrode of the first transistor of the circuit A and a control electrode of the first transistor of the circuit A of the basic circuit of succeeding stage, and a second reset transistor which is connected between the first electrode of the second transistor and the reference voltage and has an ON/OFF operation thereof controlled by the circuit C of own stage.

(3) In the display device having the above-mentioned constitution (2), a start pulse is inputted to a gate of the first transistor of the first basic circuit via an input transistor in which the second drive clock is inputted to a control electrode.

(4) In the display device having the above-mentioned constitution (2) or (3), the circuit C of each basic circuit includes: a third transistor in diode connection; a fourth transistor which has a second electrode thereof connected to a first electrode of the third transistor; a second capacitive element which is connected between the second electrode of the fourth transistor and the control electrode; and a third reset transistor which is connected between a first electrode of the fourth transistor and the reference voltage, in each odd-numbered basic circuit, the first drive clock is inputted to a second electrode and the control electrode of the third transistor of the circuit C, and the second drive clock is inputted to a control electrode of the fourth transistor of the circuit C, in each even-numbered basic circuit, the second drive clock is inputted to a second electrode and the control electrode of the third transistor of the circuit C, and the first drive clock is inputted to the control electrode of the fourth transistor of the circuit C, the second electrode of the third reset transistor of the circuit C of each basic circuit is connected to the control electrode of a first reset transistor of the circuit A of the basic circuit of own stage and the control electrode of a second reset transistor of the circuit B, and the control electrode of the third reset transistor of the circuit C of each basic circuit is connected to the first electrode of the second transistor of the circuit B of the basic circuit of the preceding stage.

(5) In the display device having the above-mentioned constitution (4), a start pulse is inputted to the control electrode of the third reset transistor of the circuit C of the first basic circuit via the input transistor.

(6) In the display device having any one of the above-mentioned constitutions (2) to (5), the display device includes a fourth reset transistor which is connected between the second electrode of the first transistor of the circuit A of each basic circuit and the reference voltage, the second drive clock is inputted to a control electrode of the fourth reset transistor of the odd-numbered basic circuit, and the first drive clock is inputted to a control electrode of the fourth reset transistor of the even-numbered basic circuit.

(7) In the display device having any one of the above-mentioned constitutions (2) to (6), in each basic circuit, a first reset transistor of the circuit A, a second reset transistor of the circuit B and a third reset transistor of the circuit C are respectively constituted of two transistors connected in series.

(8) In the display device having any one of the above-mentioned constitutions (2) to (7), the display device includes a fifth transistor which is connected between a first electrode of the second transistor of the circuit B in each basic circuit and a control electrode of the first transistor of the circuit A of the basic circuit of the succeeding stage, and a fixed bias voltage is inputted to a control electrode of the fifth transistor.

(9) In the display device having any one of the above-mentioned constitutions (2) to (8), the display device includes a fifth reset transistor which is connected between the first electrode of the second transistor of the circuit B in the third or succeeding basic circuit and the reference voltage, and has a control electrode to which a start pulse is inputted.

(10) In the display device having any one of the above-mentioned constitutions (2) to (9), the display device includes a sixth reset transistor in diode connection which is connected to the first electrode of the fourth transistor in the circuit C of the third or succeeding basic circuit, and a start pulse is inputted to a second electrode and a control electrode of the sixth reset transistor.

(11) In the display device having any one of the above-mentioned constitutions (2) to (10), each transistor is an n-type field effect transistor.

(12) In the display device having any one of the above-mentioned constitutions (2) to (10), each transistor is a p-type field effect transistor.

(13) In the display device having the above-mentioned constitution (11) or (12), a semiconductor layer of each transistor is made of polysilicon and is formed on a substrate.

(14) In the display device having the above-mentioned constitution (11) or (12), a semiconductor layer of each transistor is made of amorphous silicon and is formed on a substrate.

(15) In the display device having any one of the above-mentioned constitutions (1) to (14), the display device is a liquid crystal display device.

To briefly explain advantageous effects acquired by the typical inventions among the inventions described in this specification, they are as follows.

According to the present invention, in the display device having a single-channel shift register circuit, the number of times of writing of a voltage in the floating memory node can be increased thus enhancing time-wise likelihood for a leak current of the floating memory node.

DESCRIPTION OF THE PREFERRED EMBODIMENTS

Hereinafter, embodiments of the present invention are explained in detail in conjunction with drawings.

Here, in all drawings for explaining the embodiments, parts having identical functions are given same symbols and their repeated explanation is omitted.

Embodiment 1

Figure 1:
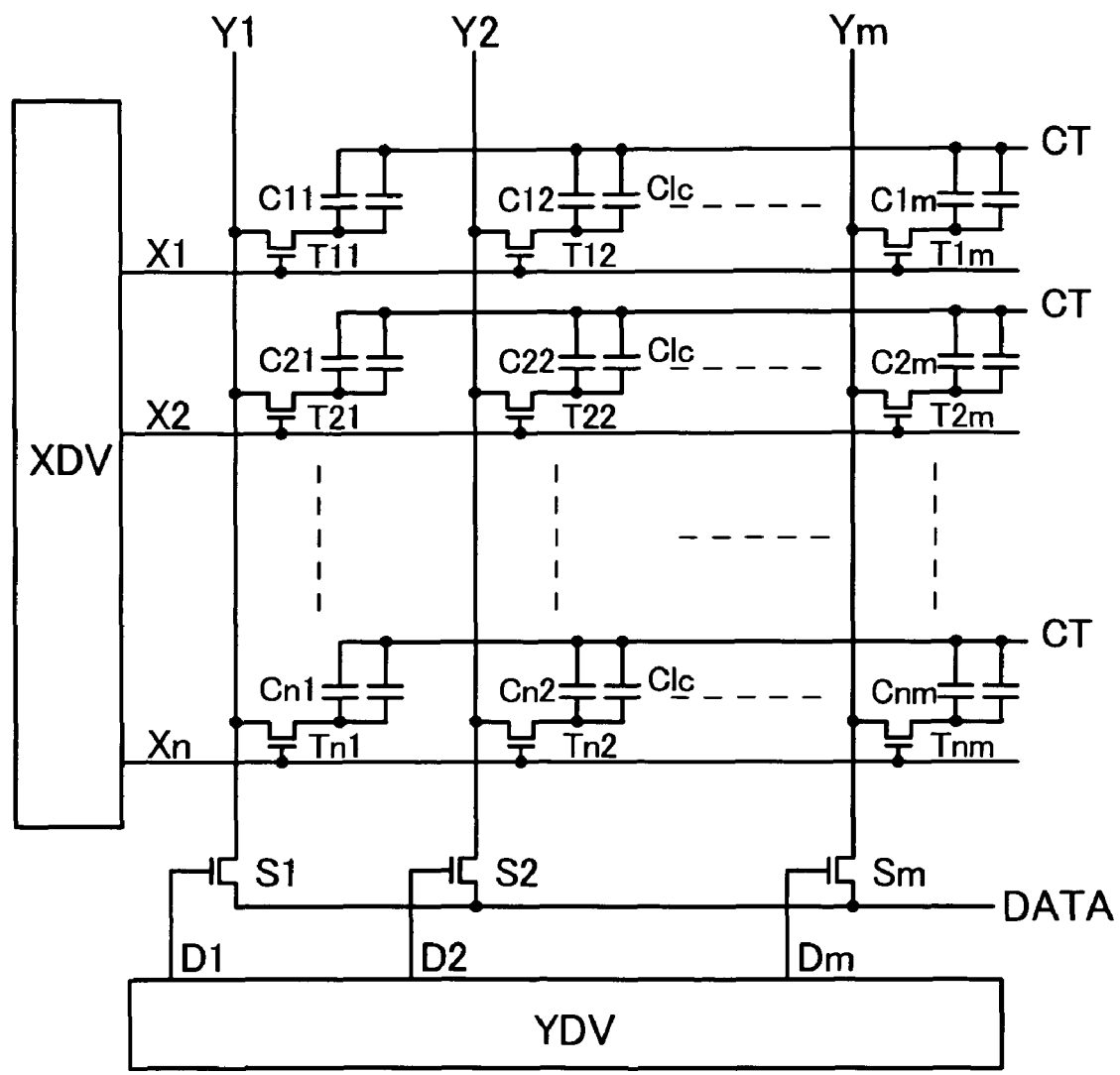
FIG. 1 is a circuit diagram showing an equivalent circuit of a liquid crystal display panel of an active-matrix-type liquid crystal display device of an embodiment 1 according to the present invention.

FIG. 1 is a circuit diagram showing an equivalent circuit of a liquid crystal display panel of an active-matrix-type liquid crystal display device of an embodiment 1 according to the present invention.

As shown in FIG. 1, the liquid crystal display panel of this embodiment includes, on a liquid-crystal-side surface of one substrate out of a pair of substrates which is arranged to face each other in an opposed manner with liquid crystal therebetween, n pieces of scanning lines (also referred to as gate lines) (X1, X2, . . . Xn) which are arranged parallel to each other in the y direction and extend in the x direction and m pieces of video lines (also referred to as source lines or drain lines) (Y1, Y2, . . . Ym) which are arranged parallel to each other in the x direction and extend in the y direction.

Regions which are surrounded by the scanning lines and the video lines constitute pixel regions. Each pixel region is provided with an active element (thin film transistor) (Tnm) which has a gate thereof connected to the scanning line, a drain (or a source) thereof connected to the video line, and a source (or a drain) thereof connected to a pixel electrode.

Further, a holding capacity (Cnm) is formed between the pixel electrode and a counter electrode (also referred to as a common electrode) (CT). Here, the liquid crystal is interposed between the pixel electrode and the counter electrode (CT) and hence, liquid crystal capacity (Clc) is also formed between the pixel electrode and the counter electrode (CT).

The respective scanning lines (X1, X2, . . . Xn) are connected to a scanning line driver circuit (XDV), and the scanning line driver circuit (XDV) sequentially supplies a selection scanning signal to the scanning lines in order from the scanning line X1 to the scanning line Xn or in order from the scanning line Xn to the scanning line X1.

The respective video lines (Y1, Y2, . . . Ym) are connected to drains (or sources) of switching elements (S1, S2, . . . Sm). The switching elements (S1, S2, . . . Sm) have sources (or drains) thereof connected to video signal lines (DATA) and have gates thereof connected to a video line driver circuit (YDV).

By operating the video line driver circuit (YDV), scanning is sequentially performed in order from the switching element S1 to the switching element Sm or in order from the switching element Sm to the switching element S1.

The liquid crystal display panel of this embodiment is constituted as follows. The first substrate on which the pixel electrodes, the thin film transistors and the like are formed (also referred to as TFT substrate or active matrix substrate) (not shown in the drawing) and the second substrate on which color filters and the like are formed (also referred to as counter substrate) (not shown in the drawing) are overlapped with each other with a predetermined gap therebetween, both substrates are adhered to each other by a sealing material which is formed in a frame shape in the vicinity of and between peripheral portions of both substrates, liquid crystal is filled and sealed in a space defined inside the sealing material between both substrates through a liquid crystal filling port formed in a portion of the sealing material, and a polarizer is laminated to outer surfaces of both substrates.

In this manner, the liquid crystal display panel of this embodiment adopts the structure in which liquid crystal is sandwiched between a pair of substrates. Further, the counter electrodes are formed on a counter substrate side when the liquid crystal display panel is a TN-type or VA-type liquid crystal display panel. When the liquid crystal display panel is an IPS-type liquid crystal display panel, the counter electrodes are formed on a TFT substrate side. Since the inner structure of the liquid crystal display panel is not relevant to the present invention, the detailed explanation of the inner structure of the liquid crystal display panel is omitted. Further, the present invention is applicable to a liquid crystal display panel having any structure.

In this embodiment, with respect to transistors which are used in the scanning line driver circuit (XDV) and the video line driver circuit (YDV) respectively, a semiconductor layer is made of polycrystalline silicon (polysilicon), and is formed on a surface of one substrate in the same step as the thin film transistor which constitutes the active element.

The scanning line driver circuit (XDV) or the video line driver circuit (YDV) shown in FIG. 1 has a shift register circuit.

Figure 2:
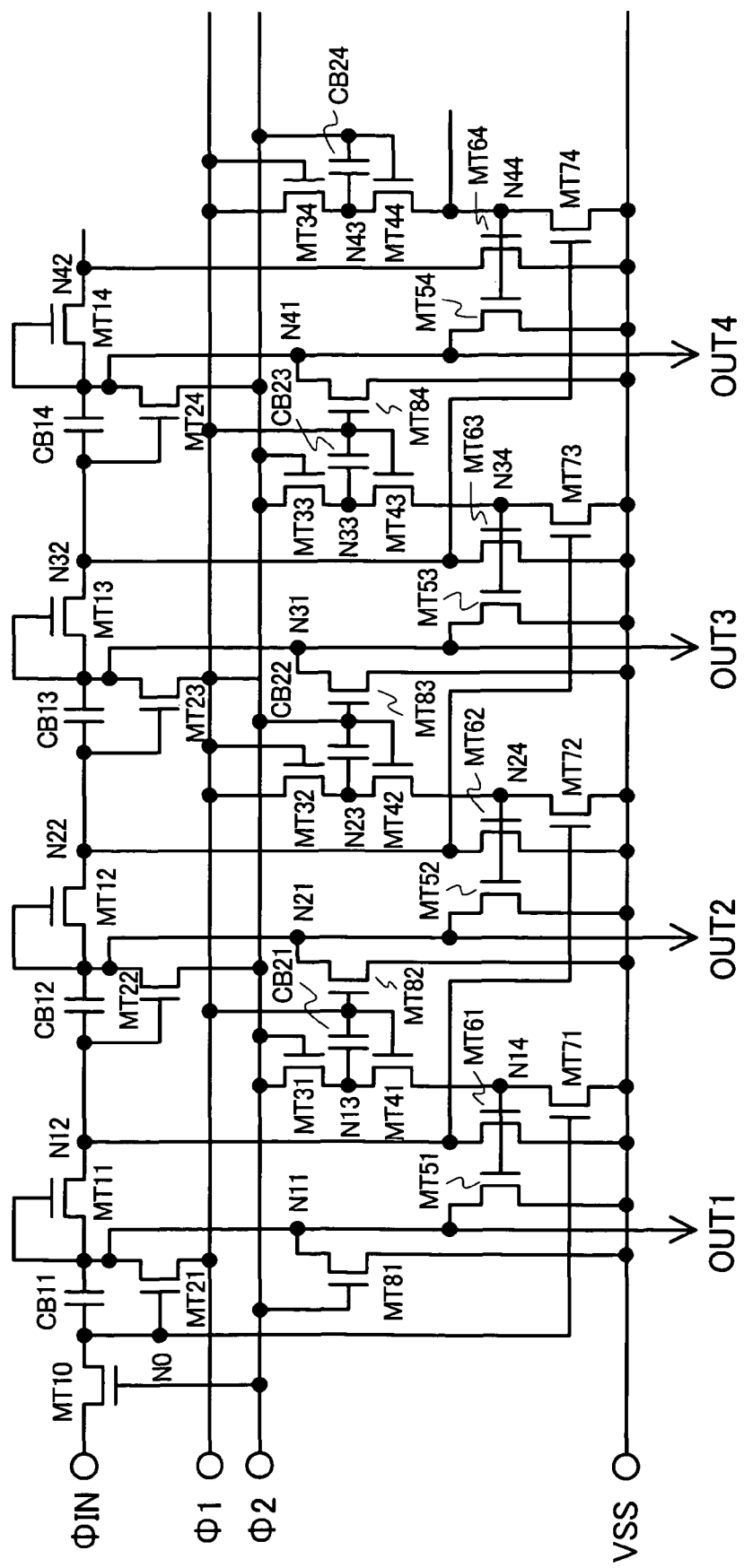
FIG. 2 is a circuit diagram showing the circuit constitution of a single-channel shift register circuit of the embodiment 1 according to the present invention.

FIG. 2 is a circuit diagram showing the circuit constitution of the shift register circuit of this embodiment.

As shown in FIG. 2, the shift register circuit of this embodiment is constituted of a plurality of basic circuits. Each basic circuit is constituted of an n-type field effect transistor (n-type MOS transistor; hereinafter simply referred to as transistor) in which a semiconductor layer is made of polysilicon formed on the first substrate.

Each basic circuit includes a transistor (first transistor of the present invention) (MT2*) (here, *=1, 2, 3, 4, ... ), a capacitive element (bootstrap capacity) (CB1*) which is connected between a gate and a drain of the transistor (MT2*), a transistor (second transistor of the present invention) (MT1*) in diode connection which is connected between the drain of the transistor (MT2*) and a gate of the transistor (MT2*) of a succeeding stage, a transistor (third transistor of the present invention) (MT3*) in diode connection which is connected between the drain of the transistor (MT2*) and the gate of the transistor (MT2*) of the succeeding stage, a transistor (fourth transistor of the present invention) (MT4*) which has a drain thereof connected to a source of the transistor (MT3*), a capacitive element (bootstrap capacity) (CB2*) which is connected between a gate and a drain of the transistor (MT4*), a transistor (first reset transistor of the present invention) (MT5*) which is connected between a drain of the transistor (MT2*) and a reference voltage (VSS), a transistor (second reset transistor of the present invention) (MT6*) which is connected between a source of the transistor (MT1*) and the reference voltage (VSS), a transistor (third reset transistor of the present invention) (MT7*) which is connected between a source of the transistor (MT4*) and the reference voltage (VSS), and a transistor (fourth reset transistor of the present invention) (MT8*) which is connected between the drain of the transistor (MT2*) and the reference voltage (VSS).

In this embodiment, a shift output is outputted from a drain of the transistor (MT2*).

In the odd-numbered basic circuit, a first drive clock (Φ1) is inputted to the source of the transistor (MT2*) and the gate of the transistor (MT4*). Further, a second drive clock ((Φ2) is inputted to a drain and a gate of the transistor (MT3*) and a gate of the transistor (MT8*). Here, the first drive clock ((Φ1) and the second drive clock ((Φ2) are clocks whose phases differ from each other by 180°.

In the even-numbered basic circuit, a second drive clock ((Φ2) is inputted to the source of the transistor (MT2*) and the gate of the transistor (MT4*). Further, a first drive clock ((Φ1) is inputted to the drain and the gate of the transistor (MT3*) and the gate of the transistor (MT8*).

Further, in each basic circuit, a gate of the transistor (MT5*) and a gate of the transistor (MT6*) are connected to a source of the transistor (MT4*), and a gate of the transistor (MT7*) is connected to a source of the transistor (MT1*) of the basic circuit of the preceding stage. A start pulse ((ΦIN) is inputted to the gate of the transistor (MT21) and the gate of the transistor (MT71) of the first basic circuit via the transistor (MT10). Here, the second drive clock ((Φ2) is inputted to the gate of the transistor (MT10).

Figure 3:
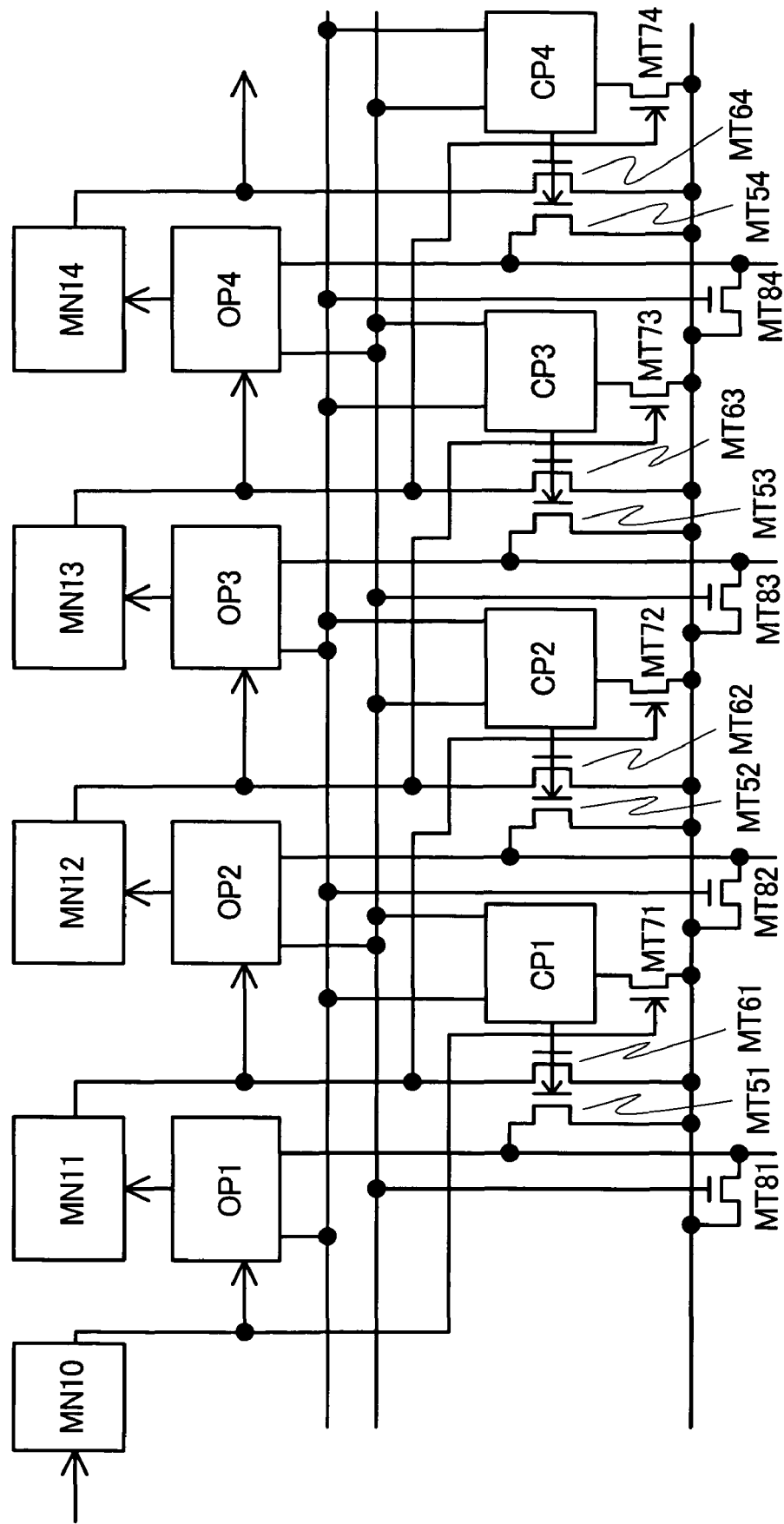
FIG. 3 is a block diagram showing the circuit shown in FIG. 2 as a functional block.

FIG. 3 is a block diagram showing the circuit shown in FIG. 2 as a functional block.

In FIG. 3, symbol OP* indicates a circuit constituted of the transistor (MT2*) and the capacitive element (CB1*) shown in FIG. 1, and symbol MN1* indicates a circuit which is constituted of the transistor (MT1*). Further, symbol CP* indicates a circuit which is constituted of the transistor (MT3*), the transistor (MT4*) and the capacitive element (CB2*).

The circuit (OP*), when transfer data is inputted to the basic circuit from the basic circuit of the preceding stage, fetches the first drive clock ((Φ1) or the second drive clock ((Φ2) inputted from the outside, outputs the transfer data as a shift output (OUT*) of the circuit (OP*) of own stage, and transfers the transfer data to the circuit (MN1*).

The circuit (MN1*) transfers the transfer data to the circuit (OP*) of the basic circuit of a succeeding stage and, at the same time, turns on the transistor (MT7*) of the basic circuit of the succeeding stage and resets the circuit (CP*).

The circuit (CP*) receives inputting of the first drive clock (Φ1) or the second drive clock (Φ2), and controls reset transistors {TR(MT5*), TR(MT6*)} which reset the circuit (OP*) in an inactive state and the circuit (MN1*) and fix the circuit (OP*) and the circuit (MN1*) at the reference voltage (VSS).

Figure 4:
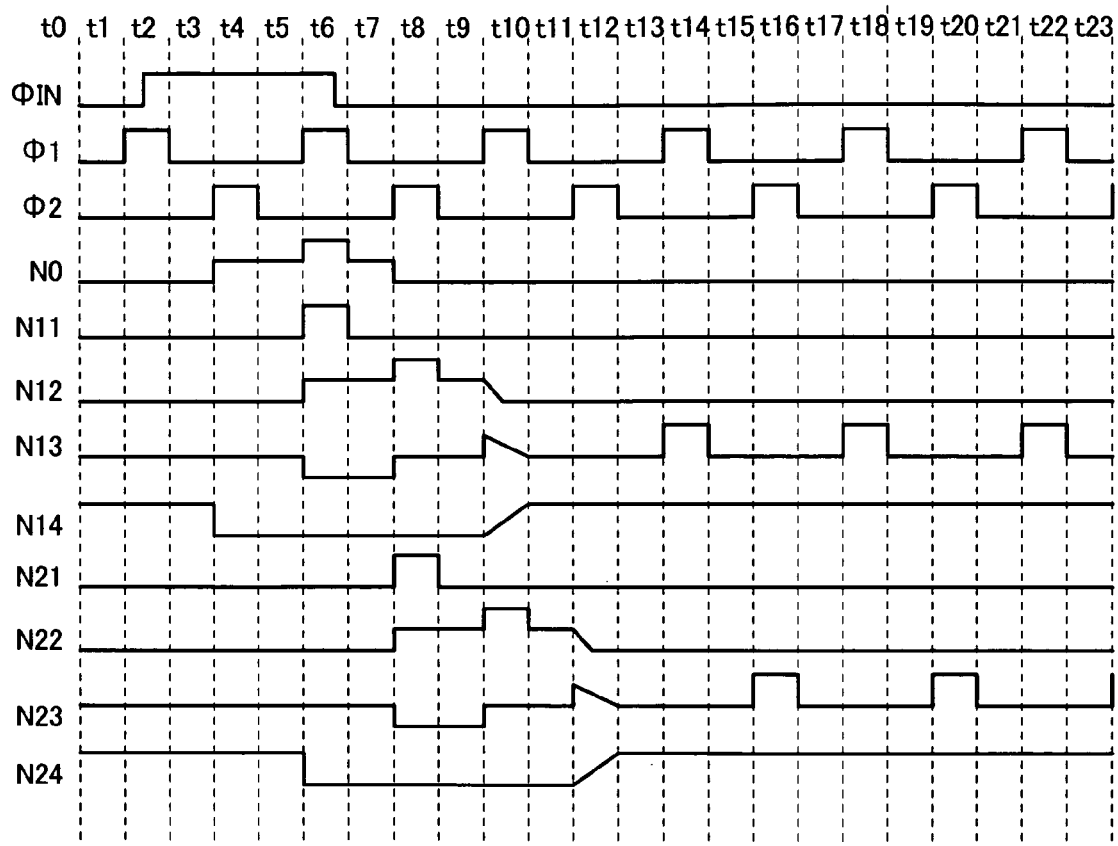
FIG. 4 is a timing chart showing voltage changes of respective nodes shown in FIG. 2.

FIG. 4 is a timing chart showing voltage changes of respective nodes shown in FIG. 2.

The manner of operation of this embodiment is explained hereinafter.

(1) In a state that the start pulse (ΦIN) assumes a High level (hereinafter referred to as H level), when the second drive clock (Φ2) assumes an H level during a period t4, the transistor (MT10) is turned on so that a node (N0) assumes an H level. Accordingly, the transistor (MT71) is turned on and a node (N14) assumes the reference voltage (VSS).

(2) Next, when the second drive clock (Φ2) assumes a Low level (hereinafter referred to as L level) during a period t5 and, thereafter, the first drive clock (Φ1) assumes an H level during a period t6, a node (N11) assumes an H level via the transistor (MT21). Accordingly, a voltage of the node (N0) is further increased due to a bootstrap effect generated by the capacitive element (CB11).

Here, by setting a bootstrap capacity (CB1*) such that the H level of the node (N*2) becomes equal to the H level of the first and second drive clocks ((Φ1, Φ2), the first drive clock having no voltage drop is outputted to the node (N11) and this first drive clock becomes the shift output (OUT1).

Further, since the transistor (MT11) is turned on, anode (N12) also assumes an H level (in a strict sense, VH−Vth). Accordingly, the transistor (MT72) is turned on, and a node (N24) assumes the reference voltage (VSS). Here, symbol VH indicates an H level voltage of the first drive clock (Φ1) and the second drive clock (Φ2), and symbol Vth indicates a threshold voltage of the transistor (MT1*).

Although the transistor (MT41) is turned on during this period, due to the elevation of the voltage at the node (N0), an ON state of the transistor (MT71) is reinforced (or exhibits low resistance) and hence, both of the node (N13) and the node (N14) are held at the reference voltage (VSS).

(3) Next, when the first drive clock (Φ1) assumes an L level during a period t7 and, thereafter, the second drive clock (Φ2) assumes an H level during a period t8, a node (N21) assumes an H level via the transistor (MT22) Accordingly, a voltage of the node (N12) is further increased due to a bootstrap effect generated by the capacitive element (CB12). Due to such an operation, as described previously, the second drive clock having no voltage drop is outputted to the node (N21), and this second drive clock becomes the shift output (OUT2).

Further, since the transistor (MT12) is turned on, a node (N22) also assumes an H level (in a strict sense, VH−Vth). Accordingly, the transistor (MT73) is turned on, and a node (N34) assumes the reference voltage (VSS). Simultaneously with such an operation, the transistor (MT81) whose gate receives inputting of the first drive clock (Φ1) is also turned on so that the node (N11) assumes the reference voltage (VSS).

Although the transistor (MT42) is also turned on during this period, due to the elevation of the voltage at the node (N12), an ON state of the transistor (MT72) is reinforced (or exhibits low resistance) and hence, both of the node (N23) and the node (N24) are held at the reference voltage (VSS).

Further, since the node (N0) assumes an L level, the transistor (MT71) is turned off so that the node (N14) assumes a floating state. Further, the node (N13) becomes an H level via the transistor (MT31).

(4) Next, when the second drive clock (Φ2) assumes an L level during a period t9 and, thereafter, the first drive clock (Φ1) assumes an H level during a period t10, a node (N31) assumes an H level via the transistor (MT23). Accordingly, a voltage of the node (N22) is further increased due to a bootstrap effect generated by the capacitive element (CB13). Due to such an operation, as described previously, the first drive clock having no voltage drop is outputted to the node (N31), and this first drive clock becomes the shift output (OUT3).

Further, since the transistor (MT13) is turned on, a node (N32) also assumes an H level (in a strict sense, VH−Vth). Accordingly, the transistor (MT74) is turned on, and a node (N44) assumes the reference voltage (VSS). Simultaneously with such an operation, the transistor (MT82) whose gate receives inputting of the first drive clock (Φ1) is also turned on so that the node (N21) assumes the reference voltage (VSS).

Although the transistor (MT43) is also turned on during this period, due to the elevation of the voltage at the node (N22), an ON state of the transistor (MT73) is reinforced (or exhibits low resistance) and hence, both of the node (N33) and the node (N34) are held at the reference voltage (VSS).

Further, since the first drive clock (Φ1) assumes an H level, due to a bootstrap effect generated by the capacitive element (CB21), a potential of the node (N13) is elevated and, at the same time, the transistor (MT41) is turned on. Due to such an operation, the node (N13) and the node (N14) are connected with each other to have the same potential. This voltage is determined based on parasitic capacity of the node (N13) and parasitic capacity of the node (N14) Here, respective constants of the transistor (MT3*), the transistor (MT4*), the transistor (MT5*), the transistor (MT6*) and the transistor (MT7*) may be set such that the transistor (MT5*) and the transistor (MT6*) are turned on with desired ON resistances.

When the node (N14) acquires such a voltage, the transistor (MT51) and the transistor (MT61) are turned on so that the node (N11) and the node (N12) assume the reference voltage (VSS).

Hereinafter, unless the voltage of the node (N14) is lowered, until the node (N12) is changed from the L level to the H level again, the node (N11) and the node (N12) are connected with the reference voltage (VSS) and hence, there exists no floating node in basic circuit of the first stage whereby it is possible to ensure a stable operation which is not influenced by disturbances.

Further, since the node (N12) assumes an L level, the transistor (MT72) is turned off so that the node (N24) assumes a floating state. Further, the node (N23) becomes an H level via the transistor (MT32).

(5) Next, when the first drive clock (Φ1) assumes an L level during a period t11 and, thereafter, the second drive clock (Φ2) assumes an H level during a period t12, a node (N41) assumes an H level via the transistor (MT24). Accordingly, a voltage of the node (N32) is further increased due to a bootstrap effect generated by the capacitive element (CB14). Due to such an operation, as described previously, the second drive clock having no voltage drop is outputted to the node (N41), and this second drive clock becomes the shift output (OUT4).

Further, since the transistor (MT14) is turned on, a node (N42) also assumes an H level (in a strict sense, VH−Vth). Accordingly, the transistor (MT75) (not shown in the drawing) is turned on, and a node (N54) (not shown in the drawing) assumes the reference voltage (VSS). Simultaneously with such an operation, the transistor (MT83) whose gate receives inputting of the second drive clock (Φ2) is also turned on so that the node (N31) assumes the reference voltage (VSS).

Although the transistor (MT44) is also turned on during this period, due to the elevation of the voltage at the node (N32), an ON state of the transistor (MT74) is reinforced (or exhibits low resistance) and hence, both of the node (N43) and the node (N44) are held at the reference voltage (VSS).

Further, since the second drive clock (Φ2) assumes an H level, due to a bootstrap effect generated by the capacitive element (CB22), a potential of the node (N23) is elevated and, at the same time, the transistor (MT42) is turned on. Due to such an operation, the node (N23) and the node (N24) are connected with each other to have the same potential, and the transistor (MT52) and the transistor (MT62) are turned on in response to the voltage of the node (N24). Accordingly, the node (N21) and the node (N22) assume the reference voltage (VSS).

Hereinafter, unless the voltage of the node (N24) is lowered, until the node (N22) is changed from the L level to the H level again, the node (N21) and the node (N22) are connected with the reference voltage (VSS) and hence, there exists no floating node in the basic circuit of the second stage whereby it is possible to ensure a stable operation which is not influenced by disturbances.

Further, since the node (N22) assumes an L level, the transistor (MT73) is turned off so that the node (N34) assumes a floating state. Further, the node (N33) becomes an H level via the transistor (MT32).

Hereinafter, the substantially same operation is repeated. Here, the operation of the node (N13) and the operation of the node (N23) are explained in more detail.

During this period, the transistor (MT31) is turned on again, and the node (N13) assumes an H level (in a strict sense, VH−Vth) again.

(6) Next, when the second drive clock (Φ2) assumes an L level during a period t13 and, thereafter, the first drive clock (Φ1) assumes an H level during a period t14, due to a bootstrap effect generated by the capacitive element (CB21), a potential of the node (N13) is increased and, at the same time, the transistor (MT41) is turned on. Due to such an operation, the node (N13) and the node (N14) are connected with each other to have the same potential.

This operation is repeatedly performed so that the node (N14) approximates the voltage (VH−Vth). Accordingly, an ON state of the transistor (MT51) and an ON state of the transistor (MT61) are maintained so that the voltage of the node (N11) and the voltage of the node (N12) assume the reference voltage (VSS).

Further, during this period, the transistor (MT32) is turned on again, and the node (N23) assumes an H level (in a strict sense, VH−Vth) again.

(7) Next, when the first drive clock (Φ1) assumes an L level during a period t15 and, thereafter, the second drive clock (Φ2) assumes an H level during a period t16, due to a bootstrap effect generated by the capacitive element (CB22), a potential of the node (N23) is increased and, at the same time, the transistor (MT42) is turned on. Due to such an operation, the node (N23) and the node (N24) are connected with each other to have the same potential.

This operation is repeatedly performed so that the voltage of the node (N24) approximates the voltage (VH−Vth).

Accordingly, an ON state of the transistor (MT52) and an ON state of the transistor (MT62) are maintained so that the voltage of the node (N21) and the voltage of the node (N22) assume the reference voltage (VSS).

As has been explained heretofore, in this embodiment, for acquiring the stable operation, the state of the node (N*4) which is connected to the gates of the transistors (MT5*, MT6*) for connecting the floating nodes (N*1, N*2) of the inactive stage to the reference voltage (VSS) is reinforced due to the bootstrap effect in conformity with a cycle of either one of the first and second drive clocks (Φ1, Φ2).

Accordingly, compared to writing of the voltage by the conventional circuit in which the voltage is written in the memory node (N*4) one time for every 1 cycle, this embodiment can realize remarkably stable operation for a leak current from the reset transistor (MT7*) or the like.

To take a shift register circuit having 240-stage constitution as an example, compared to the conventional circuit, according to this embodiment, the restriction on a holding time of the floating memory node can be attenuated approximately (120+a) (a: blanking period) times. That is, this implies that the likelihood for the leak current from the reset transistor (MT7*) or the like is increased approximately (120+a) times thus realizing the deregulation of standards on threshold voltages (Vth) of using transistors.

Embodiment 2

Figure 5:
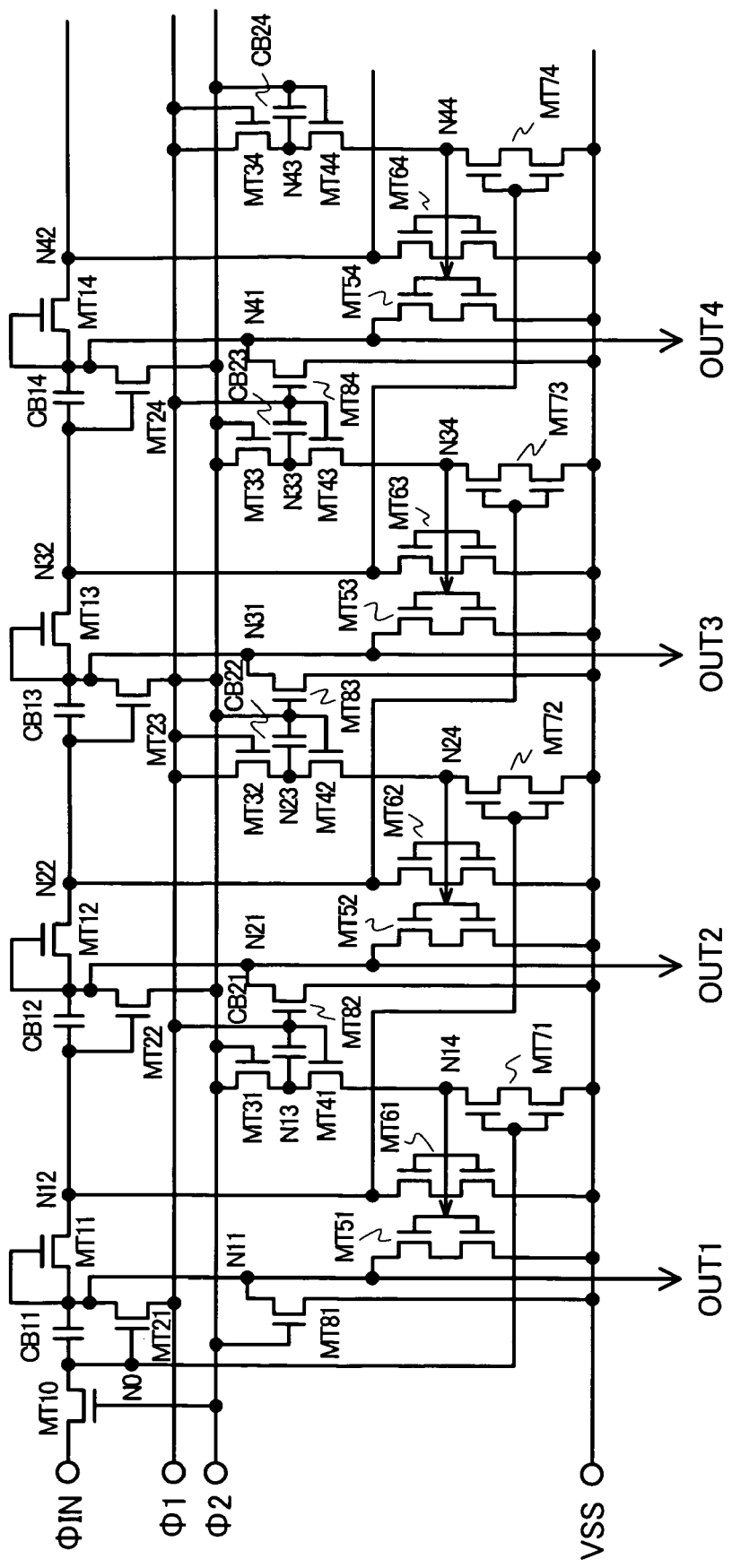
FIG. 5 is a circuit diagram showing the circuit constitution of a single-channel shift register circuit of an embodiment 2 according to the present invention.

FIG. 5 is a circuit diagram showing the circuit constitution of a shift register circuit of an embodiment 2 according to the present invention.

This embodiment is characterized in that, in the circuit shown in FIG. 2, the transistors (MT5*, MT6*, MT7*) which are exclusively used for resetting are formed of a transistor having the double gate structure thus realizing the enlargement of likelihood of a leak current.

Embodiment 3

Figure 6:
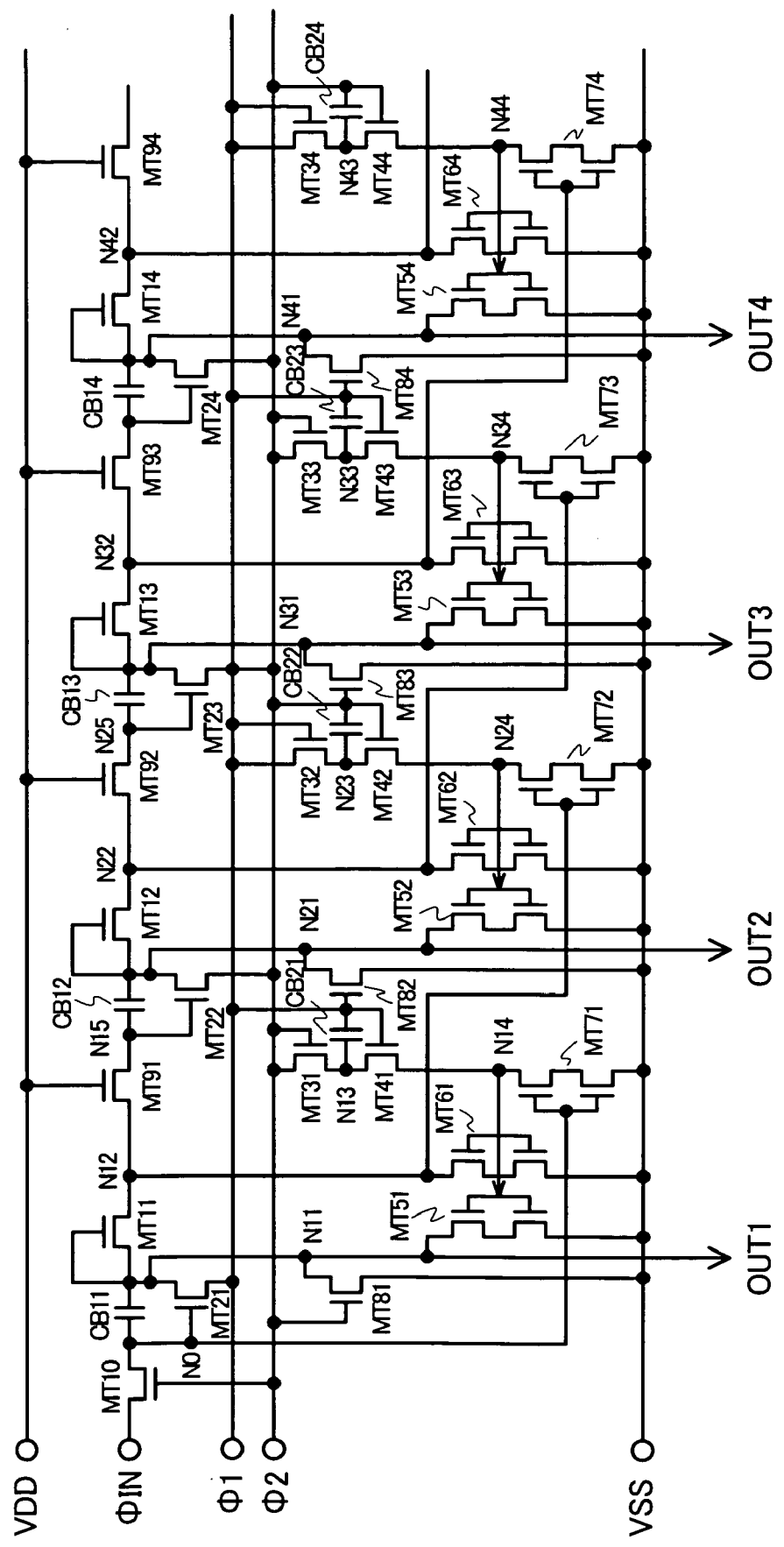
FIG. 6 is a circuit diagram showing the circuit constitution of a single-channel shift register circuit of an embodiment 3 according to the present invention.

FIG. 6 is a circuit diagram showing the circuit constitution of a shift register circuit of an embodiment 3 according to the present invention.

This embodiment is characterized in that, in the circuit shown in FIG. 5, a transistor (fifth transistor of the present invention) (MT9*) is inserted between the source of the transistor (MT1*) of each basic circuit and the gate of the transistor (MT2*) of the basic circuit of the succeeding stage. Here, a fixed bias voltage (VDD) having an H level is inputted to the gate of the transistor (MT9*).

The transistor (MT9*) is provided for preventing the further elevation of the voltage of the node (N*2) exceeding approximately the voltage (VDD−Vth) even when the voltage of the node (N*5) is elevated due to the bootstrap effect. As a result of the prevention of further elevation of the voltage of the node (N*2), the elevation of the drain voltage when the transistor (MT5*) is turned off can be suppressed thus enhancing the likelihood for an unstable operation due to a leak current attributed to a source-drain break down voltage (Bvds).

This advantageous effect is described in the above-mentioned patent document 2 (JP-A-2006-10784) in detail. It is also possible to add the transistor (MT9*) to the circuit shown in FIG. 2.

Figure 7:
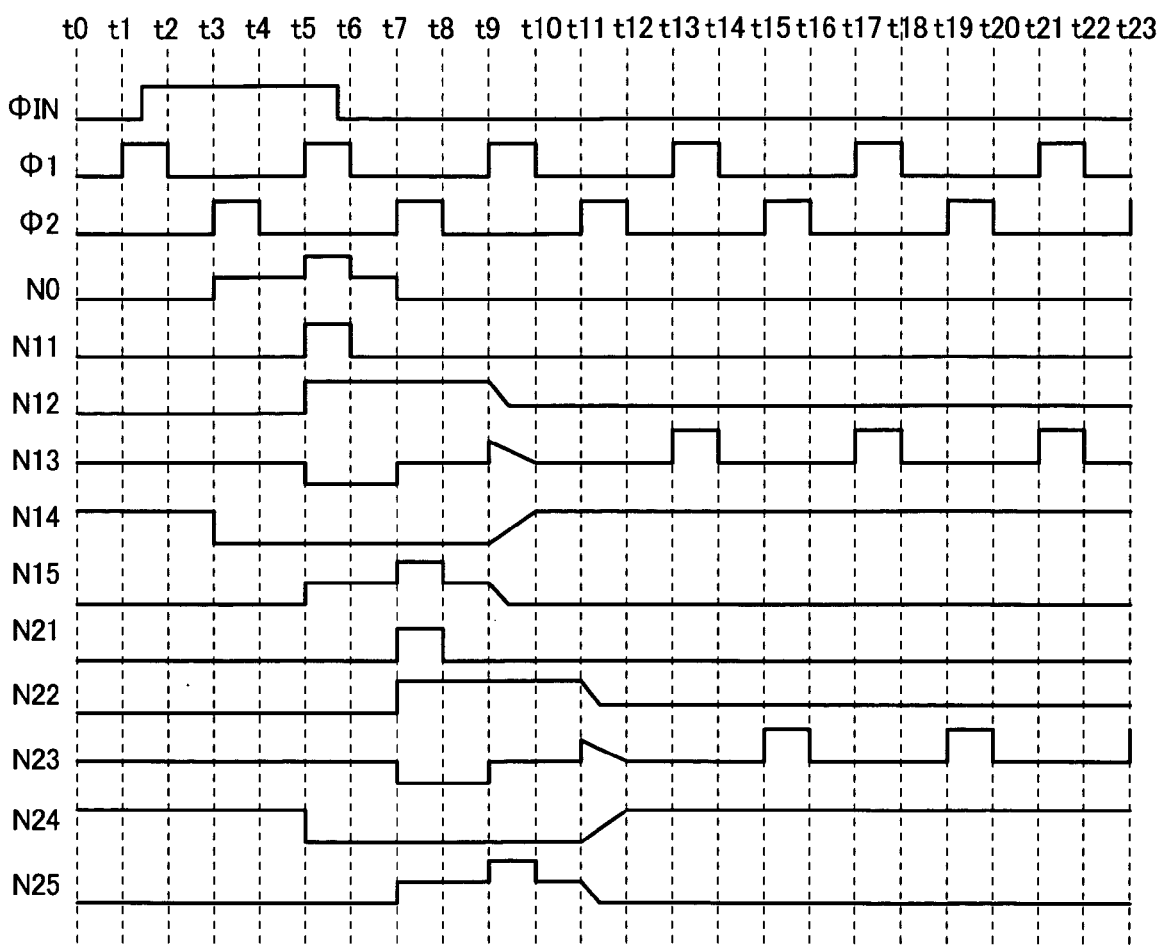
FIG. 7 is a timing chart showing voltage changes of respective nodes shown in FIG. 6.

FIG. 7 shows a timing chart of the circuit shown in FIG. 6.

In this embodiment, as shown in FIG. 7, the timing chart differs from the timing chart shown in FIG. 4 with respect to a point that although the voltage at the node (N*5) is elevated due to the bootstrap effect generated by the capacitive element (CB1*), the node (N*2) does not obtain the bootstrap effect generated by the capacitive element (CB1*). However, other operations are performed at the same timings shown in FIG. 4 and hence, the detailed explanation of these operations is omitted.

Embodiment 4

Figure 8:
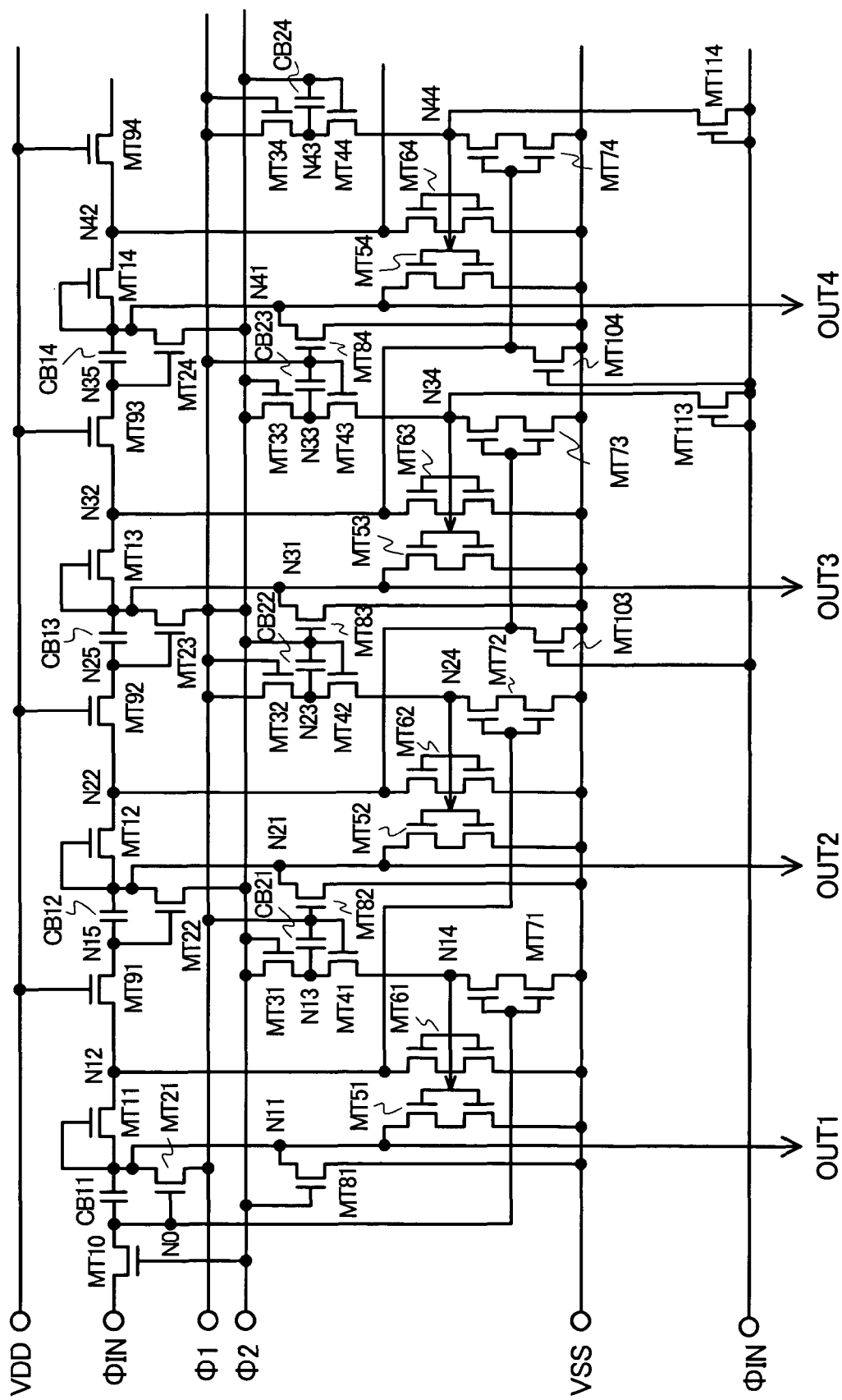
FIG. 8 is a circuit diagram showing the circuit constitution of a single-channel shift register circuit of an embodiment 4 according to the present invention.
Figure 9:
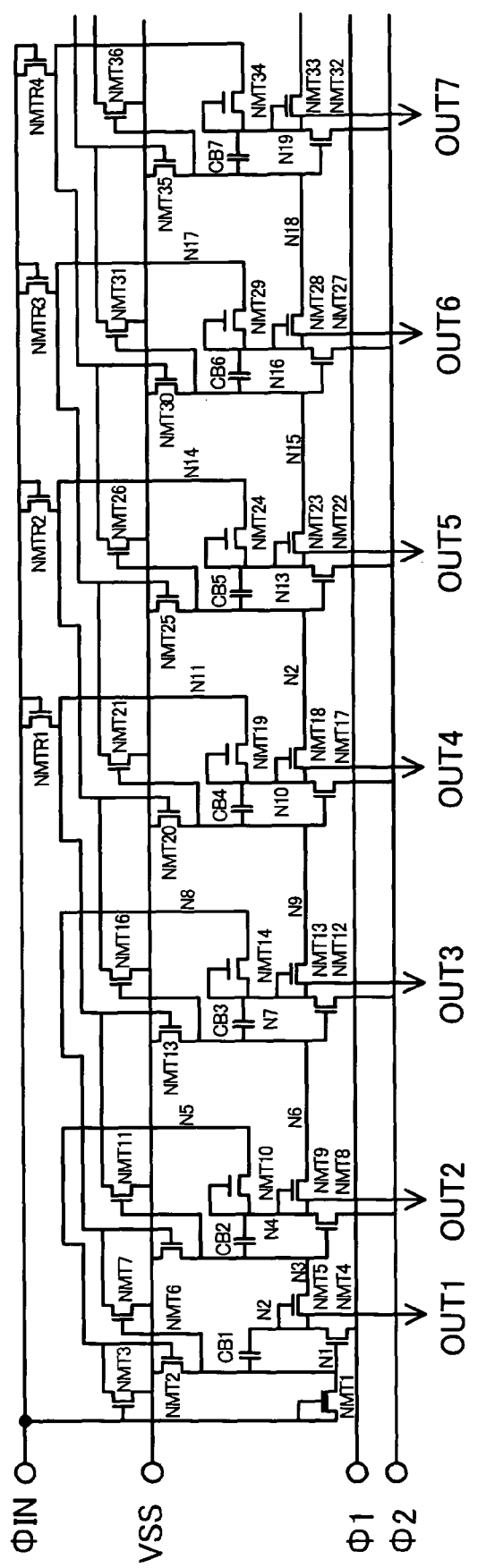
FIG. 9 is a circuit diagram showing the circuit constitution of a conventional single-channel shift register circuit.

FIG. 8 is a circuit diagram showing the circuit constitution of a shift register circuit of an embodiment 4 according to the present invention.

This embodiment is characterized in that a transistor (fifth reset transistor of the present invention) (MT10*) and a transistor (sixth reset transistor of the present invention) (MT11*) (*=3, 4, 5, . . . ) are added to the basic circuit of the third stage and the basic circuits of succeeding stages.

The transistor (MT10*) is connected between the source of the transistor (MT1*) and the reference voltage (VSS), and a start pulse (ΦIN) is inputted to a gate of the transistor (MT10*).

The transistor (MT10*) is provided for ensuring the L levels of the nodes (N*2) of the basic circuit of the third stage and the basic circuits of succeeding stages by forcibly connecting the nodes (N*2) (*=3, 4, 5, . . . ) of the basic circuit of the third stage and the succeeding stages to the reference voltage (VSS) when the start pulse (ΦIN) assumes an H level at the time of starting an operation of the circuit.

With respect to the transistor (MT11*) in diode connection whose source is connected to the source of the transistor (MT4*), the start pulse (ΦIN) is inputted to a gate and a drain of the transistor (MT11*).

The transistor (MT11*) is provided for ensuring the H levels of the nodes (N*4) (*=3, 4, 5, . . . ) of the basic circuit of the third stage and the basic circuits of succeeding stages when the start pulse (ΦIN) assumes an H level at the time of starting an operation of the circuit.

The transistor (MT10*) and the transistor (MT11*) constitute circuit for ensuring a stable operation state by connecting the floating nodes to a bias voltage at the time of supplying electricity.

In the above-mentioned explanation, the case in which all transistors are made of the n-type MOS transistor has been explained. However, by inverting the H level and the L level of the power source voltage and the drive clocks, all transistors can be formed of a p-type MOS transistor.

Further, an MIS transistor can also be used in place of the MOS transistor. The above-mentioned shift register circuit may be formed of a transistor in which a semiconductor layer is made of silicon, and may be incorporated in the inside of the semiconductor chip as a circuit.

In the above-mentioned embodiments, the present invention has been explained with respect to the embodiments in which the present invention is applied to the shift register circuit of the liquid crystal display device. However, the present invention is not limited to the shift register circuit of the liquid crystal display device. For example, the present invention is also applicable to a shift register circuit used in other display device such as an organic EL display device.

Although the invention made by inventors of the present invention has been specifically explained based on the embodiments, it is needless to say that the present invention is not limited to such embodiments, and various modifications can be made without departing from the gist of the present invention.

What is claimed is:

1. A display device comprising:

a display panel having a plurality of pixels; and a driver circuit which drives the respective pixels, the driver circuit having a shift register circuit, and wherein the shift register circuit is constituted of basic circuits in plural stages, each basic circuit is constituted of a circuit A, a circuit B and a circuit C, in the odd-numbered basic circuit, the circuit A fetches a first drive clock inputted from the outside at the time of inputting of transfer data from the basic circuit of preceding stage, outputs the first drive clock as a shift output of the basic circuit of own stage, and transfers transfer data to the circuit B, the circuit B transfers the transfer data to the circuit A of the basic circuit of succeeding stage and resets the circuit C, the circuit C resets the circuit A and the circuit B in synchronism with a first drive clock generated at next timing or timing which comes after the next timing of the first drive clock, and in the even-numbered basic circuit, the circuit A fetches a second drive clock which is inputted from the outside and has a phase different from a phase of the first drive clock at the time of inputting of transfer data from the basic circuit of preceding stage, outputs the second drive clock as a shift output of the basic circuit of own stage, and transfers transfer data to the circuit B, the circuit B transfers the transfer data to the circuit A of the basic circuit of succeeding stage and resets the circuit C, and the circuit C resets the circuit A and the circuit B in synchronism with a second drive clock generated at next timing or timing which comes after the next timing of the second drive clock, and wherein the circuit A of each basic circuit includes:

a first transistor which outputs the shift output from a second electrode;

a first capacitive element which is connected between a control electrode of the first transistor and the second electrode of the first transistor; and a first reset transistor which is connected between the second electrode of the first transistor and a reference voltage and has an ON/OFF operation thereof controlled by the circuit C of the basic circuit of own stage, a first drive clock is inputted to a first electrode of the first transistor of the circuit A of each odd-numbered basic circuit, a second drive clock is inputted to the first electrode of the first transistor of the circuit A of each even-numbered basic circuit, and the circuit B of each basic circuit includes a second transistor in diode connection which is connected between the second electrode of the first transistor of the circuit A and the control electrode of the first transistor of the circuit A of the basic circuit of succeeding stage, and a second reset transistor which is connected between a first electrode of the second transistor and the reference voltage and has an ON/OFF operation thereof controlled by the circuit C of own stage, and wherein the circuit C of each basic circuit includes:

a third transistor in diode connection;

a fourth transistor which has a second electrode thereof connected to a first electrode of the third transistor;

a second capacitive element which is connected between the second electrode of the fourth transistor and a control electrode of the fourth transistor; and a third reset transistor which is connected between a first electrode of the fourth transistor and the reference voltage, in each odd-numbered basic circuit, the second drive clock is inputted to a second electrode and a control electrode of the third transistor of the circuit C, and the first drive clock is inputted to the control electrode of the fourth transistor of the circuit C, in each even-numbered basic circuit, the first drive clock is inputted to the second electrode and the control electrode of the third transistor of the circuit C, and the second drive clock is inputted to the control electrode of the fourth transistor of the circuit C, a second electrode of the third reset transistor of the circuit C of each basic circuit is connected to a control electrode of the first reset transistor of the circuit A of the basic circuit of own stage and a control electrode of the second reset transistor of the circuit B, and a control electrode of the third reset transistor of the circuit C of each basic circuit having a preceding stage that is connected to the first electrode of the second transistor of the circuit B of the basic circuit of the preceding stage.

2. A display device according to claim 1, wherein a start pulse is inputted to a gate of the first transistor of the first basic circuit via an input transistor in which the second drive clock is inputted to a control electrode.

3. A display device according to claim 1, wherein a start pulse is inputted to the control electrode of the third reset transistor of the circuit C of the first basic circuit via the input transistor.

4. A display device according to claim 1, wherein the display device includes a fourth reset transistor which is connected between the second electrode of the first transistor of the circuit A of each basic circuit and the reference voltage, the second drive clock is inputted to a control electrode of the fourth reset transistor of the odd-numbered basic circuit, and the first drive clock is inputted to a control electrode of the fourth reset transistor of the even-numbered basic circuit.

5. A display device according to claim 1, wherein in each basic circuit, a first reset transistor of the circuit A, a second reset transistor of the circuit B and a third reset transistor of the circuit C are respectively constituted of two transistors connected in series.

6. A display device according to claim 1, wherein the display device includes a fifth transistor which is connected between the first electrode of the second transistor of the circuit B of each basic circuit and the control electrode of the first transistor of the circuit A of the basic circuit of the succeeding stage, and a fixed bias voltage is inputted to a control electrode of the fifth transistor.

7. A display device according to claim 1, wherein the display device includes a fifth reset transistor which is connected between the first electrode of the second transistor of the circuit B of the third or succeeding basic circuit and the reference voltage, and has a control electrode to which a start pulse is inputted.

8. A display device according to claim 1, wherein the display device includes a sixth reset transistor in diode connection which is connected to the first electrode of the fourth transistor in the circuit C of the third or succeeding basiccircuit, and a start pulse is inputted to a second electrode and a control electrode of the sixth reset transistor.

9. A display device according to claim 1, wherein a semiconductor layer of said each transistor is made of polysilicon and is formed on a substrate.

10. A display device according to claim 1, wherein a semiconductor layer of said each transistor is made of amorphous silicon and is formed on a substrate.

11. A display device according to claim 1, wherein the display device is a liquid crystal display device.

* * * * *